United States Patent [19]

Ikemoto

[11] Patent Number: 5,793,202
[45] Date of Patent: Aug. 11, 1998

[54] POSITION SENSOR, EMPLOYING ELECTROMAGNETIC INDUCTION

[75] Inventor: Takeshi Ikemoto, Tokyo, Japan

[73] Assignee: NEC Corporation, Japan

[21] Appl. No.: 604,828

[22] Filed: Feb. 23, 1996

[30] Foreign Application Priority Data

Feb. 28, 1995 [JP] Japan ................. 7-039920

[51] Int. Cl.$^6$ ................. G01B 7/00; G01D 5/20; G01D 5/243; H03M 1/64
[52] U.S. Cl. ................. 324/207.17; 318/660; 324/207.18; 324/207.24; 340/870.32; 341/116
[58] Field of Search ................. 324/207.12, 207.13, 324/207.17, 207.18, 207.24; 336/45, 115, 121, 122, 129; 318/653, 659–661; 340/870.31, 870.32, 870.35, 870.36; 341/112, 115, 116

[56] References Cited

U.S. PATENT DOCUMENTS

| 3,673,585 | 6/1972 | Tripp et al. ............ 336/129 X |
| 3,783,385 | 1/1974 | Dunn et al. . |
| 4,324,218 | 4/1982 | Hattori et al. . |
| 4,358,723 | 11/1982 | Scholl et al. ............ 318/661 |
| 4,417,469 | 11/1983 | Stevenson et al. . |
| 4,499,548 | 2/1985 | Beebe . |
| 4,503,922 | 3/1985 | Brosh et al. ............ 324/207.16 X |
| 4,827,531 | 5/1989 | Milford . |
| 5,070,485 | 12/1991 | Nyce ............ 324/207.13 X |

FOREIGN PATENT DOCUMENTS

| 62-291515 | 12/1987 | Japan ............ G01D 5/245 |
| 2-271587 | 11/1990 | Japan ............ H05K 1/02 |
| 2-275314 | 11/1990 | Japan ............ G01D 5/245 |
| 4-11421 | 1/1992 | Japan ............ G01D 5/245 |

*Primary Examiner*—Gerard R. Strecker
*Attorney, Agent, or Firm*—Hayes, Soloway, Hennessey, Grossman & Hage, P.C.

[57] ABSTRACT

A position sensor is provided with a displacement signal output circuit 1 that amplifies an electromagnetically induced and detected current signal from a slider and converts the result to a rectangular wave signal; a phase difference detection circuit that compares the output signal from the displacement signal output circuit with a clock signal employed for producing the alternating current component from the scaler and detects the phase difference; and an interpolation pulse counter that determines digital displacement data from the phase difference detected at phase difference detection circuit using interpolation pulses. Further, an averaging circuit is provided at the output stage of this interpolation pulse counter which calculates and outputs an average value of a plurality of instances of digital displacement data successively calculated by the interpolation pulse counter.

7 Claims, 7 Drawing Sheets

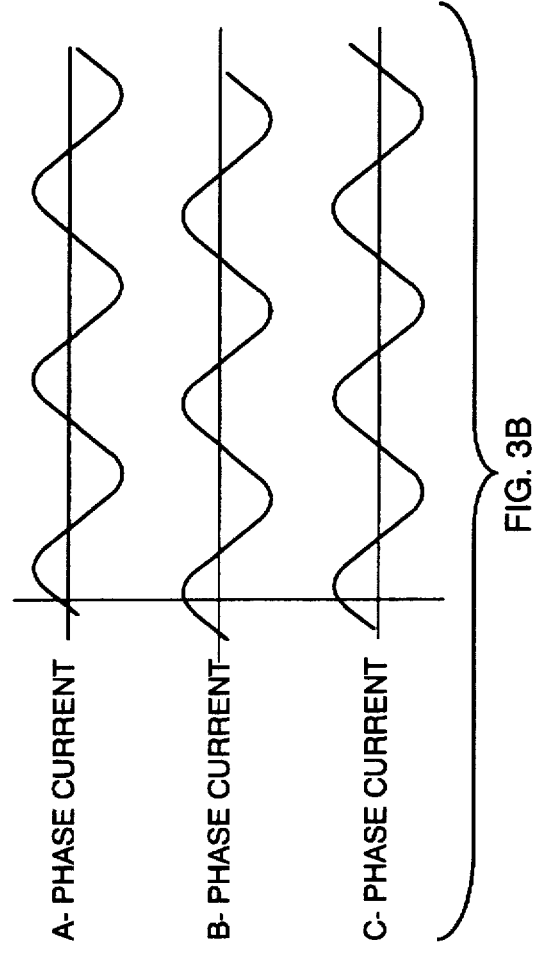
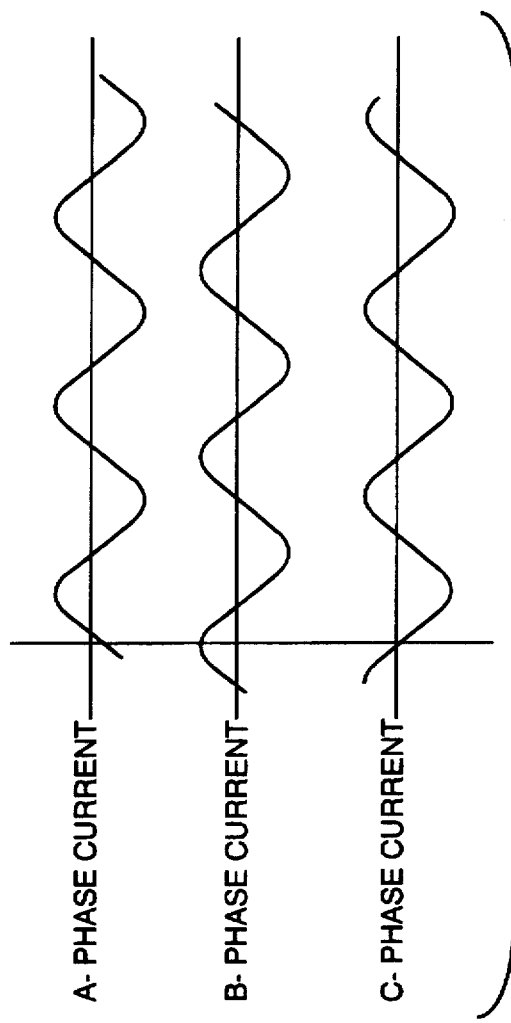
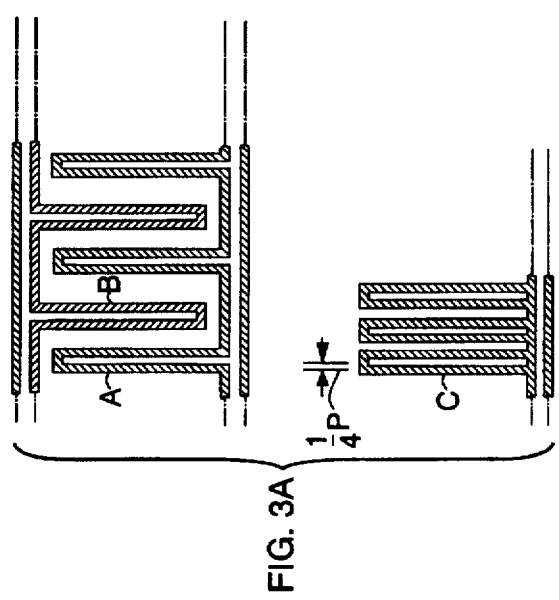
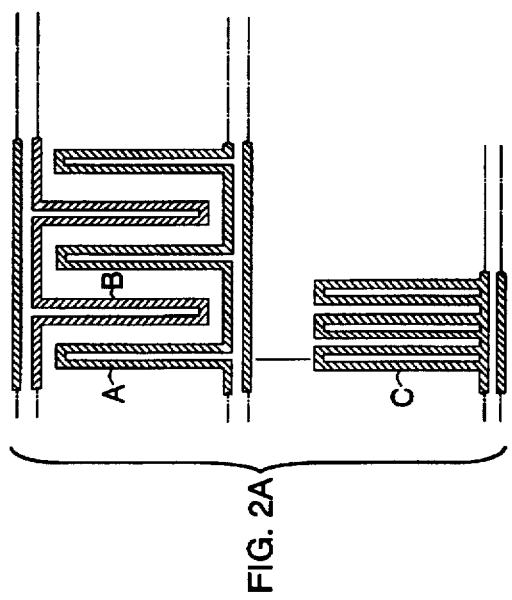

POSITION SENSOR, EMPLOYING ELECTROMAGNETIC INDUCTION

BACKGROUND OF THE INVENTION:

1. Field of the Invention:

The present invention relates to a position sensor, and particularly to a position sensor employing an induction sensor that detects the amount of displacement of a target object through an electromagnetic induction method.

2. Description of the Related Art:

Induction sensors are generally provided with a scaler and a slider, each comprising a substrate provided with a flat coil or coils on one surface. The surfaces of the scaler and slider on which the coils are mounted are arranged to face each other across a small gap, and the amount of displacement is detected through an electromagnetic induction method (Reference may be made to, for example, Japanese Utility Model Laid-open No. 11421/92).

In general, the scaler is fixed as the main sensor unit while the slider is fixed to the object whose position is to be detected and therefore shifts in position with respect to the scaler. Two-phase alternating current flows through the scaler coils and the amount of displacement of the object of detection is detected by utilizing the voltage induced in the slider coil.

The construction of this type of induction sensor is explained below with reference to the accompanying figures. FIG. 1A shows the coil pattern of two coils, coil A and coil B, belonging to a scaler, coil B being formed and arranged at a position with respect to coil A that is space-phase shifted in the direction of slider displacement a distance of ¼ pitch interval greater than the coil pitch interval P of slider coil C shown in FIG. 1B. The coil pitches of coils A and B are both 3P. As known in the prior art, when sine wave alternating currents phase-shifted ¼-cycle (90°) with respect to each other pass through coil A and coil B, a shifting field is generated in the direction of the slider position to be detected, and accordingly, a sine wave induction voltage is induced in coil C through the effect of electromagnetic induction of this shifting field.

In this case, the phase of voltage induced in coil C varies according to the position of the displaced slider with respect to the scaler, the nature of this relation being shown in FIGS. 2A, 2B to FIGS. 5A, 5B. These figures illustrate the phase relationship of the alternating currents flowing in each of coils A, B, and C; FIGS. 2A, 2B; FIGS. 3A, 3B; FIGS. 4A, 4B; and FIGS. 5A, 5B respectively showing cases in which the space-phases of coil C and coil A (1) coincide; (2) are shifted ¼-P; (3) are shifted ½-P; and (4) are shifted ¾-P. In this way, the phase of the induced current of coil C varies according to the position of the slider with respect to scaler.

As to a method of controlling a prior art position sensor that employs such an induction sensor substrate, as shown in FIG. 6, the alternating current component of the slider that is electromagnetically induced from the scaler is amplified by a detection signal amplifier circuit 51, and this amplified signal is passed through comparator 52 and converted to a rectangular wave signal. The phase difference between the rectangular wave signal, which depends on the signal obtained from the slider, and the clock employed for producing the alternating current component of the above-described scaler is next detected using phase difference detection circuit 53. This phase difference is measured digitally using interpolation pulses (high-speed clock) inputted to interpolation pulse counter 54, and digital displacement data are determined from the number of interpolation pulses. Reference numeral 55 indicates a latch circuit which latches the number of interpolation pulses corresponding to the measured phase difference and outputs the result as control output.

According to the above-described example of the prior art, one signal containing position information is used to generate the displacement data. Therefore, in order to raise the detection accuracy of the induction sensor, either the accuracy of the induction sensor substrate itself must be increased, or the frequency of the clock that determines digital displacement data must be increased.

Regarding a means of increasing accuracy of the induction sensor substrate, Japanese Patent Laid-open No. 275314/90 discloses a technique by which the number of induction paths alternately arranged on the induction sensor substrate are formed as two or more outgoing and returning paths. Alternatively, Japanese Patent Laid-open No. 271555/90 discloses a means of preventing peeling of the corner portions of the square induction sensor substrate by forming the corner portions as curves and preventing degradation of accuracy caused by distortion by increasing the solidity and durability of the induction sensor substrate.

Nevertheless, there are limits to the above-described method of raising clock frequency to raise accuracy of the induction sensor substrate itself, and on the circuit level, this method must be considered undesirable because it exposes the environment to noise. In addition, there is the drawback that attempts to improve accuracy of the substrate itself requires processing that requires skill and intuition developed over many years of experience.

SUMMARY OF THE INVENTION:

The object of the present invention is to solve the problems inherent in the aforesaid examples of the prior art, and in particular, to provide a position sensor that allows improvement in the accuracy of measurements by an induction sensor without necessitating processing of the substrate for achieving increased accuracy of the induction sensor substrate itself or raising the frequency of the clock that determines displacement data.

A position sensor according to the present invention employs a construction that includes:

a slider composed of a substrate having a flat coil of one phase provided continuously at an equal pitch interval on one surface;

a scaler composed of a substrate having flat coils of two phases each provided continuously at equal pitch intervals on one surface opposing the slider substrate and separated from the slider substrate by a gap, a coil of one phase being positioned with respect to the coil of the other phase at a distance ¼-pitch interval greater than the coil pitch interval of the slider;

a displacement signal output circuit that amplifies a current signal from the slider that is electromagnetically induced and detected when sine wave alternating currents of two phases having phase difference of 90° with respect to each other flow through the two coils of the scaler, and moreover, converts the amplified current signal to a corresponding rectangular wave signal;

a phase difference detection circuit that compares the output signal from the displacement signal output circuit with a clock signal obtained from the scaler employed for producing the alternating current component in the scaler, and detects a phase difference;

an interpolation pulse counter that determines digital displacement data from the phase difference detected at the phase difference detection circuit using interpolation pulses; and an averaging circuit at the output stage of the interpolation pulse counter that calculates and outputs an average value of a predetermined plurality of instances of digital displacement data successively calculated at the interpolation pulse counter.

According to another feature of the present invention, the above-described averaging circuit is provided with a full adder that inputs and adds digital displacement data for every instance of measurement and a divider that averages the digital displacement data added at the full adder by the number of instances of measurement.

According to another feature of the present invention, the above-described averaging circuit is provided with a buffer that temporarily stores input data.

The alternating current component flowing in the slider coil that is electromagnetically induced from the coils of the scaler as described above is amplified by the detection signal amplifier circuit and converted to a rectangular wave signal by a comparator. Phase difference is then detected by a phase difference detection circuit using the rectangular wave signal obtained from the comparator and a clock signal employed for producing the alternating current component of the scaler. This phase difference is digitally measured using interpolation pulses (high-speed clock) inputted to an interpolation pulse counter, and digital displacement data are determined from the number of interpolation pulses.

These digital displacement data are next averaged by an averaging circuit and outputted as control output. In other words, the digital displacement data inputted to the full adder of the averaging circuit are added for a prescribed number of measurement times. When addition for the set number of measurement times is completed, these data are divided by the number of instances of measurement using a divider, and the result is outputted as averaged control output. Division by the divider may also be effected by software.

The above and other objects, features, and advantages of the present invention will become apparent from the following description based on the accompanying drawings which illustrate an example of a preferred embodiment of the present invention.

BRIEF DESCRIPTION OF THE DRAWINGS:

FIG. 2A shows the coil positional relationship when the space phase of scaler coil A and slider coil C coincide.

FIG. 2B shows the phase relationship of the sine wave alternating currents flowing in each of coils A, B, and C at the coil positions shown in FIG. 2A.

FIG. 3A shows the positional relationship when the space phase of coil A and coil C is shifted by ¼ of the pitch P of coil C.

FIG. 3B shows the phase relationship of the sine wave alternating currents flowing in each of coils A, B, and C at the coil positions shown in FIG. 3A.

DETAILED DESCRIPTION OF THE PREFERRED EMBODIMENTS:

One embodiment of the present invention will next be explained with reference to the accompanying figures.

Figure 7:
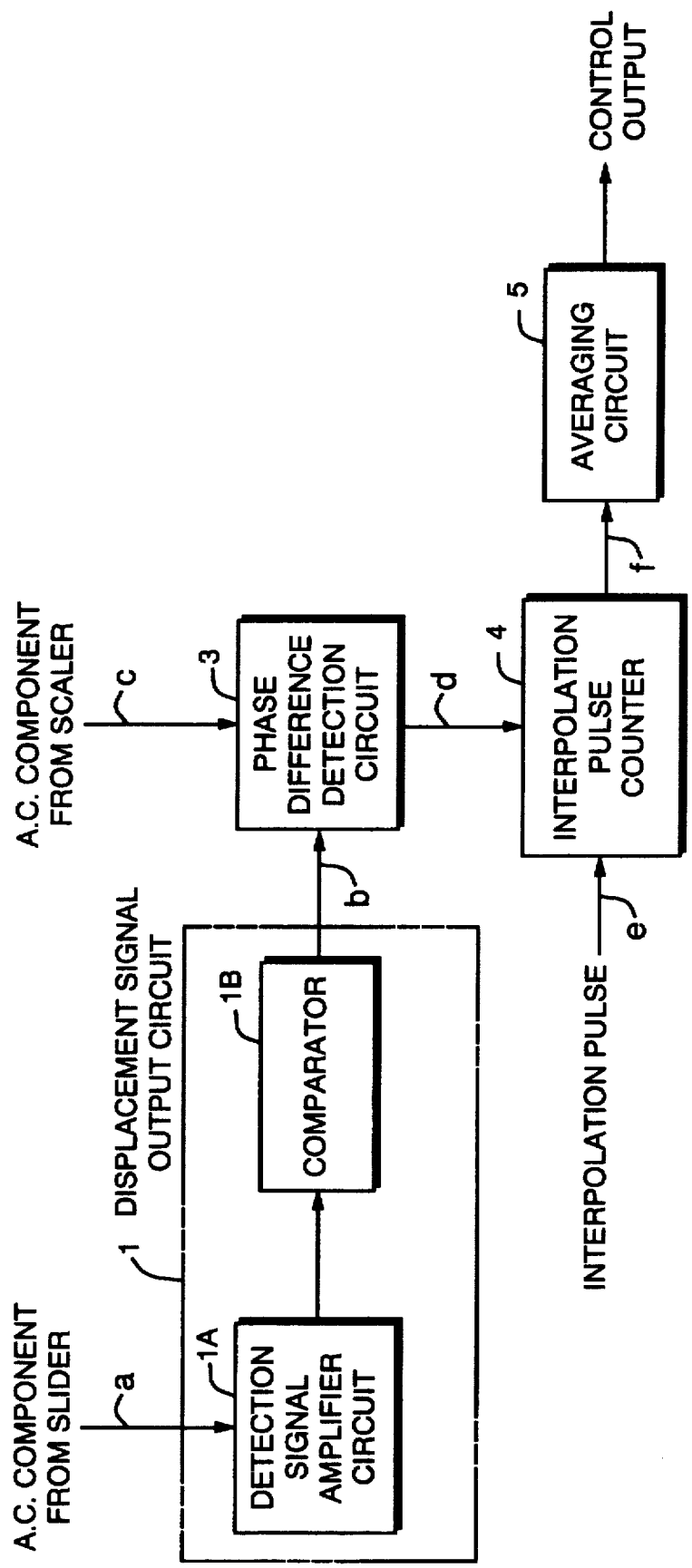
FIG. 7 is a block diagram showing the construction of the control circuit portion in a first embodiment of a position sensor according to the present invention.

The embodiment shown in FIG. 7 is provided with a scaler composed of a substrate provided with flat coils of two phases on one surface and a slider composed of a substrate provided with a flat coil of one phase on a surface opposing the scaler, the arrangement of the coils of the scaler and slider being identical to that of the above-described example of the prior art, and the relative positions of the scaler and slider allowing electromagnetic detection (omitted in the figure).

Figure 8:
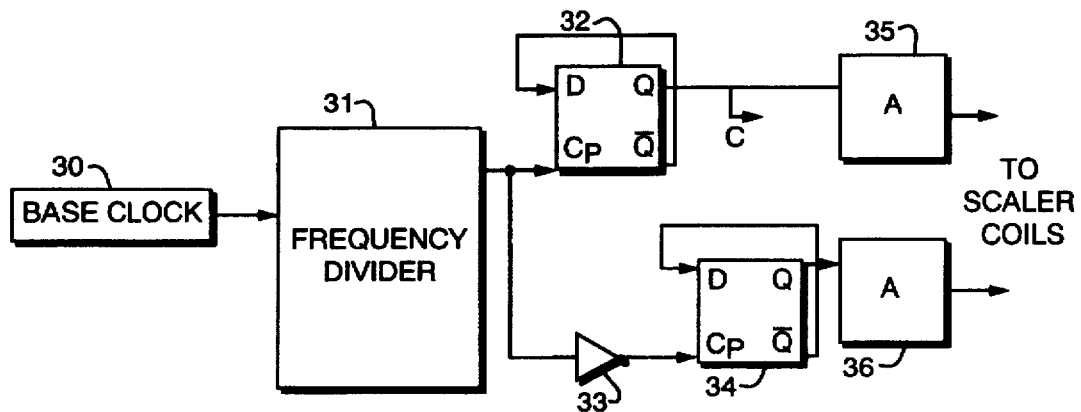
FIG. 8 shows the construction of the two-phase sine wave alternating current generation circuit of the scaler in the embodiment of FIG. 7.

FIG. 8 shows the construction of a generating circuit of sine wave alternating currents that are supplied to the coils of two phases of the scaler. A base clock signal supplied to frequency divider 31 from base clock 30 is divided into prescribed frequencies by frequency divider 31 and supplied to the clock terminal of D-FF 32 directly and to the clock terminal of D-FF 34 by way of inverter 33. Accordingly, clock signals of two phases phase-shifted 90° with respect to each other are generated from D-FF 32 and D-FF 34, and these clock signals are inputted to sine wave generation circuits 35 and 36, respectively. Sine wave alternating currents of two phases phase-shifted 90° with respect to each other are supplied from sine wave generation circuit 35 and 36 to the coils of two phases A and B, respectively, of the scaler.

Figure 1A:
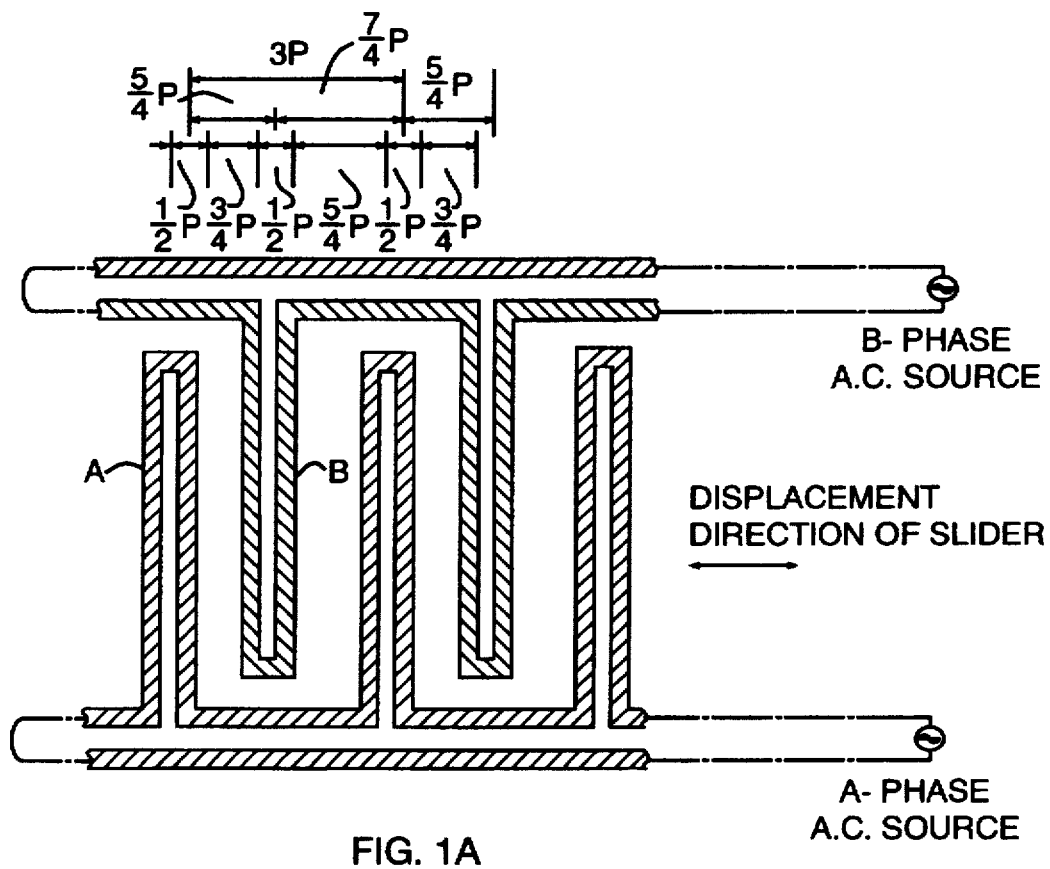
FIG. 1A shows the construction and arrangement of the scaler coils of an induction sensor substrate.
Figure 1B:
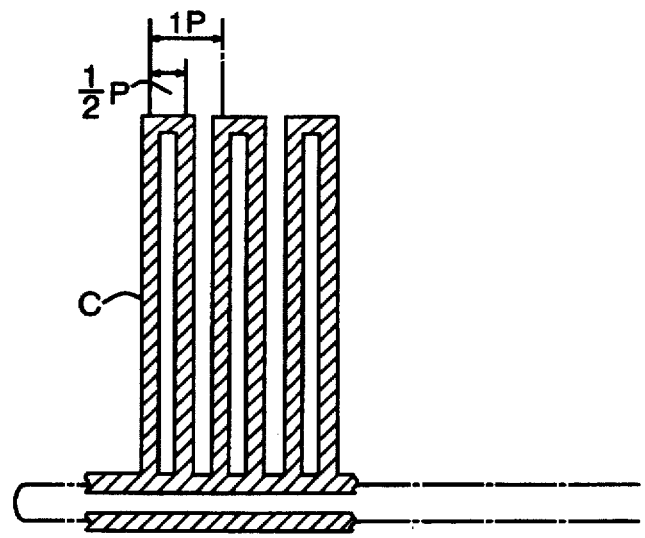
FIG. 1B shows the construction and arrangement of the slider coil of an induction sensor substrate.
Figure 4A:
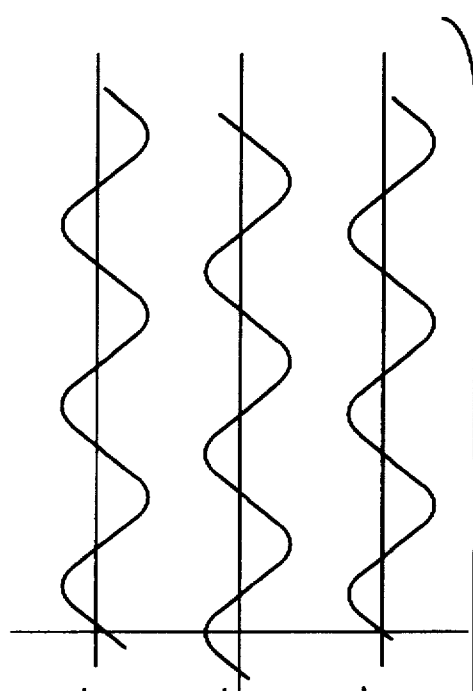
FIG. 4A shows the positional relationship when the space phase of coil A and coil C is shifted by ½-P.
Figure 4B:
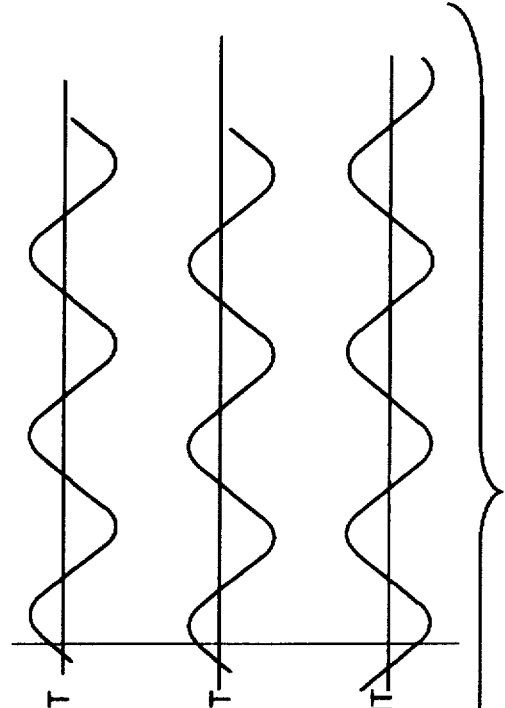
FIG. 4B shows the phase relationship of the sine wave alternating currents flowing in each of coils A, B, and C at the coil positions shown in FIG. 4A.
Figure 5A:
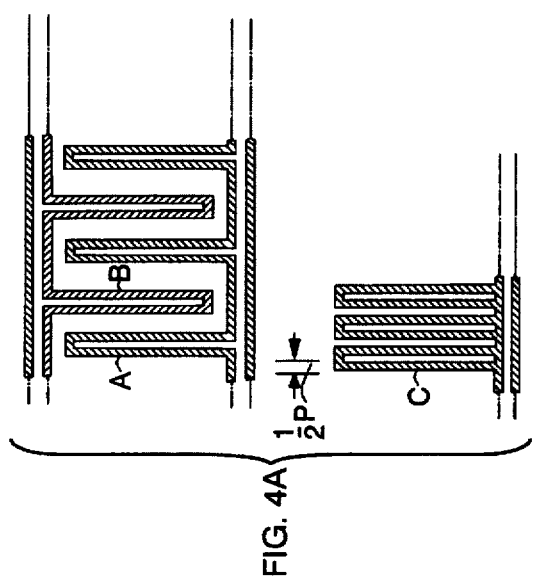
FIG. 5A shows the positional relationships when the space phase of coil A and coil C is shifted ¾-P.
Figure 5B:
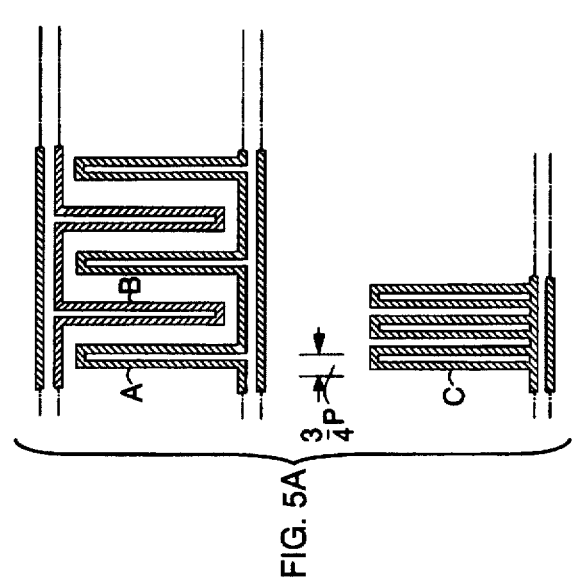
FIG. 5B shows the phase relationship of the sine wave alternating currents flowing in each of coils A, B, and C at the coil positions shown in FIG. 5A.
Figure 6:
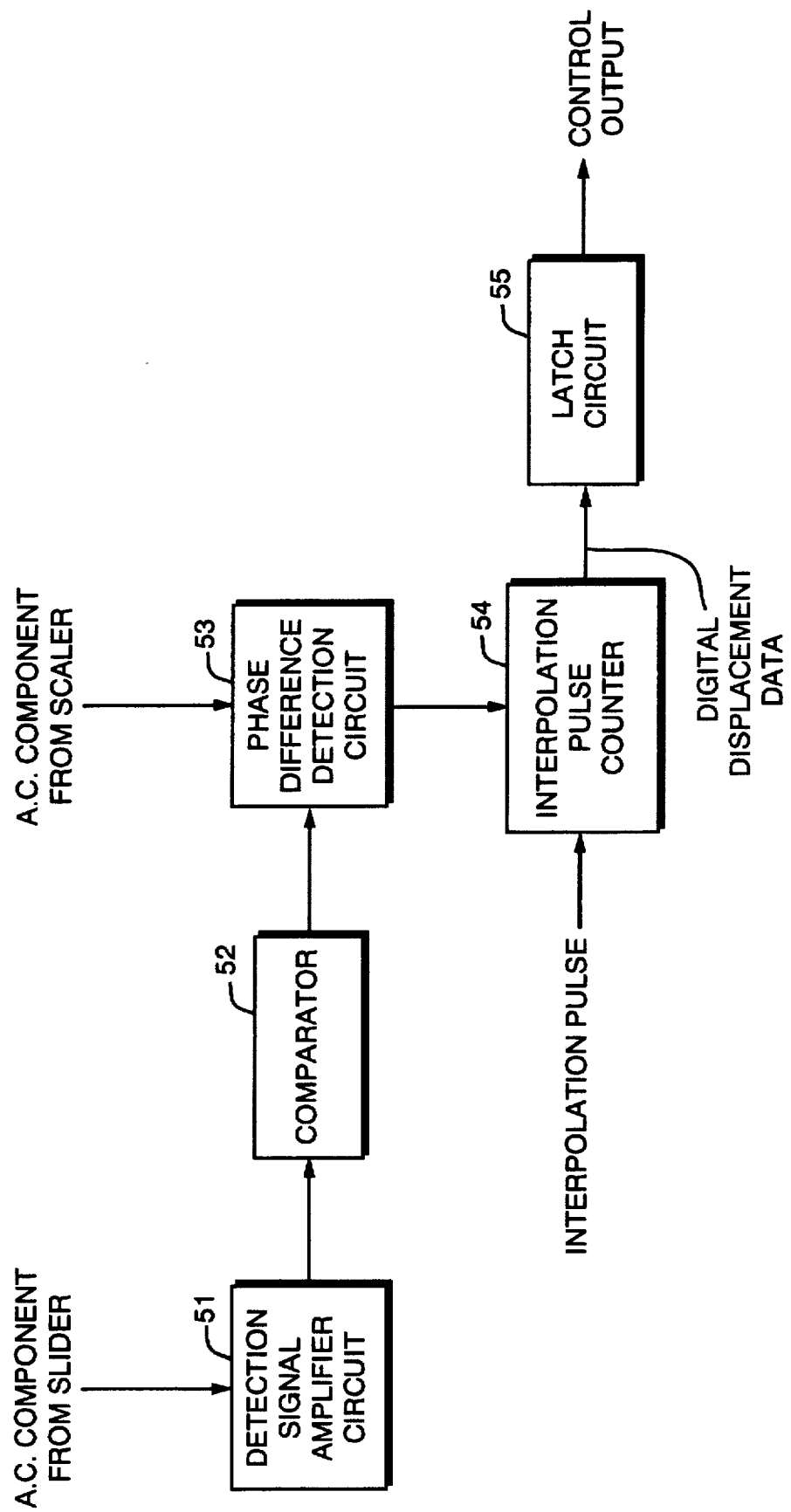
FIG. 6 is a block diagram showing the construction of a prior art position sensor using an induction sensor.

Displacement signal output circuit 1, which amplifies the electromagnetically induced and detected current signal a from the slider and moreover, converts signal a to a rectangular wave signals phase difference detection circuit 3, which compares output signal b from displacement signal output circuit 1 with clock signal c employed for producing the alternating current component from the above-described scaler, detects the phase difference between them, and outputs phase difference signal d, and interpolation pulse counter 4, which determines digital displacement data f from phase difference signal d detected by phase difference detection circuit 3 using interpolation pulses e, are each identical to the prior art components of FIG. 6. Here, displacement signal output circuit 1 is composed of detection signal amplifier circuit 1A and comparator 1B which converts the output of detection signal amplifier circuit 1A to a rectangular wave.

Averaging circuit 5 is installed at the output stage of interpolation pulse counter 4 and calculates and outputs an average value of the digital displacement data for the plurality of successive calculations at interpolation pulse counter 4.

Figure 10:
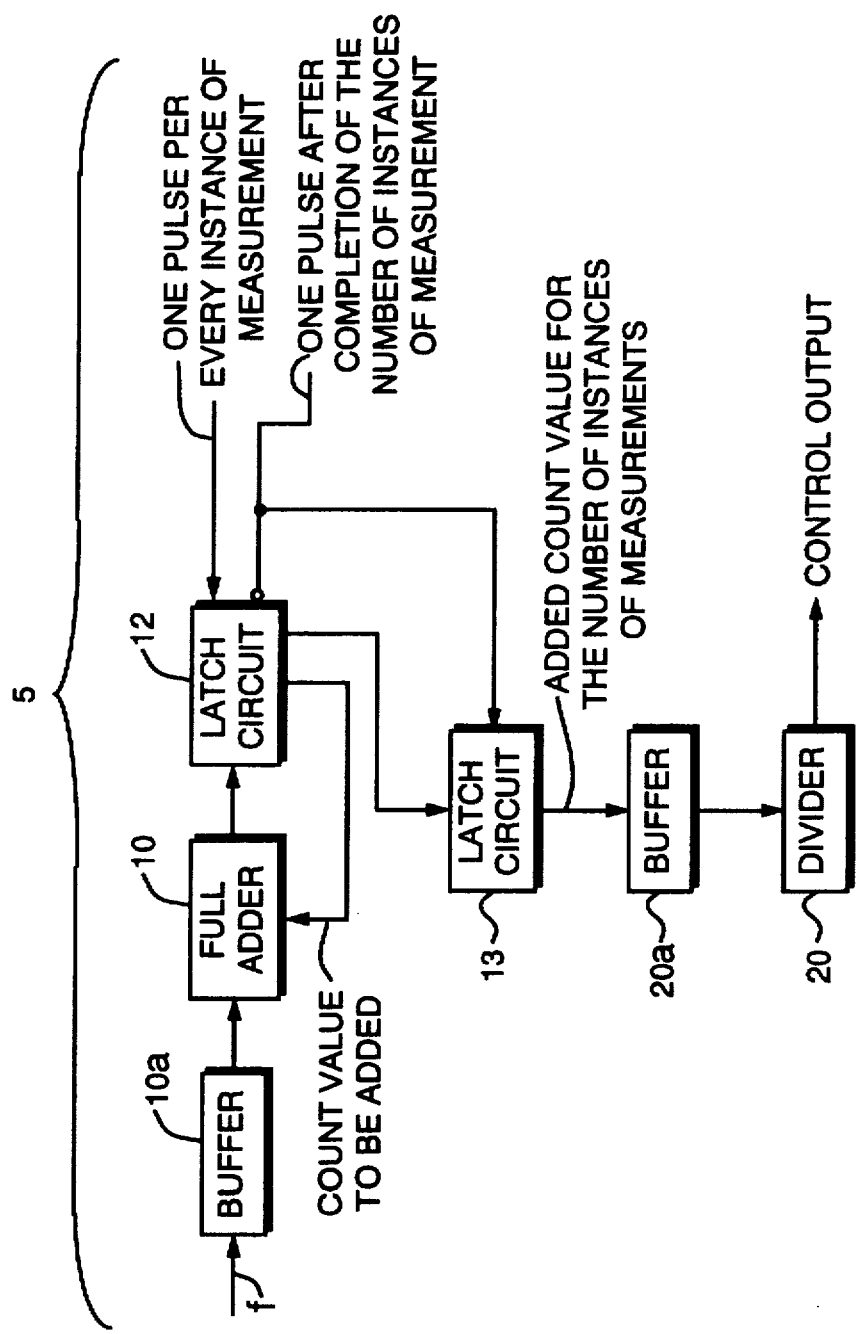
FIG. 10 shows the construction of the averaging circuit of FIG. 7.

As shown in FIG. 10, averaging circuit 5 is equipped with full adder 10 that inputs the above-described digital displacement data f for every, measurement, and divider 20 which averages the digital displacement data calculated at full adder 10 by the number of measurements.

The operation of the present embodiment will next be described. The alternating current component of the slider that is electromagnetically induced by the scaler as described hereinabove is inputted to displacement signal output circuit 1 as current signal a, amplified by detection signal amplifier circuit 1A, and converted to a rectangular wave signal by comparator 1B.

Phase difference is detected by phase difference detection circuit 3 based on rectangular wave signal b obtained from displacement signal output circuit 1 and clock c employed for producing the alternating current component of the scaler. Signal d, which indicates this phase difference, is inputted to interpolation pulse counter 4, which measures phase difference d using interpolation pulses e (high-speed clock) and determines digital displacement data f from the number of interpolation pulses e.

Figure 9:
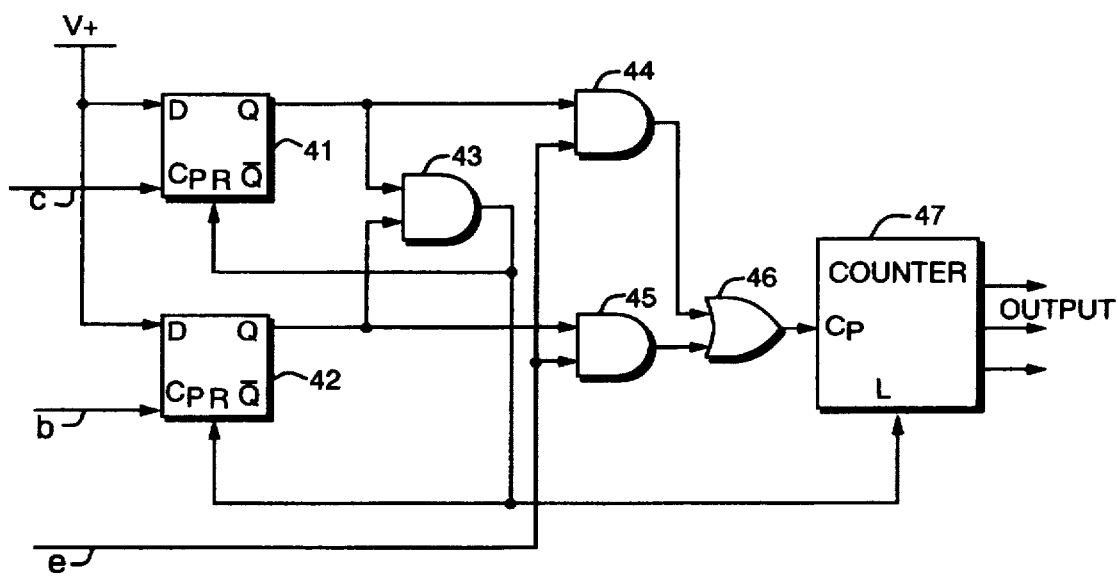
FIG. 9 shows the construction of the phase difference detection circuit and interpolation pulse counter of FIG. 7.

FIG. 9 shows the circuit construction of phase difference detection circuit 3 and interpolation pulse counter 4. Clock signal c outputted by D-FF 32, which is shown in FIG. 8, and rectangular wave signal b outputted by displacement signal output circuit 1 are supplied to the clock terminals of D-FF 41 and D-FF 42, respectively, and the Q-terminal outputs of each of DF-F 41 and D-FF 42 are supplied to AND circuit 43. The phase difference between the two clock signals is accordingly detected by AND circuit 43, and counter 47 is enabled only for the time interval corresponding to this phase difference. The Q-outputs of D-FF 41 and DFF 42 are also inputted to one terminal of AND circuits 44 and 45, respectively, high-speed interpolation pulse signal e is inputted to the other terminal of AND circuits 44 and 45, the outputs of AND circuits 44 and 45 are inputted to OR circuit 46, and the output of OR circuit 46 is inputted to the clock terminal of counter 47. Accordingly, counter 47 counts the number of pulses of interpolation pulse signal e during the interval of phase difference between clock signal c and clock signal b and supplies the result to averaging circuit 5 as digital displacement data f.

The multiple digital displacement data f thus obtained are then averaged by averaging circuit 5, one example of which is shown in FIG. 10.

In FIG. 10, digital displacement data f entering full adder 10 by way of buffer 10A provided at the input section are first latched by latch circuit 12. Digital displacement data f that are next inputted are added to the first digital displacement data first latched in latch circuit 12, and these added digital displacement data are again latched in latch circuit 12.

Next, the third digital displacement data f to enter are further added to the sum of the first and next digital displacement data already latched in latch circuit 12 by full adder 10 and the result is again latched in latch circuit 12.

In this way, digital displacement data f that successively enter full adder 10 are added for a set number of measurement times. Here, the latch timing of latch circuit 12 is set to latch upon completion of each measurement. Essentially, latch circuit 12 functions to successively latch the sums resulting from each successive instance of new digital displacement data.

When the set number of measurement times is completed, latch circuit 12 is cleared and the data summed for the number of measurement times are latched in a separate latch circuit 13 provided in the next section. These data are then divided by the number of instances of measurement at divider 20 and the result is outputted as averaged control data. Reference numeral 20A indicates a buffer provided at the input section of divider 20 for temporarily storing input data. In addition, division at divider 20 may, for example, be carried out by software.

Through the above-described construction, an average value derived from a plurality of measurements using an induction sensor can be used as one displacement data value, thereby enabling improvement of the accuracy of an induction sensor without requiring increased accuracy of the induction sensor substrate and the processing associated therewith or increased frequency of the clock that determines the amount of displacement, and in addition, allowing output of stable control data, these advantages further allowing increased reliability of the overall device.

Furthermore, while the present embodiment describes a hardware device, these functions may all be realized through software.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A position sensor comprising:
    a slider composed of a substrate having a flat coil provided continuously at an equal pitch interval on one surface;
    a scaler composed of a substrate having two flat coils, each of the coils of the scaler being provided continuously at equal pitch itervals on one surface opposing said slider substrate and separated from said slider substrate by a gap, one of said scaler coils being positioned with respect to another of the scaler coils at a distance ¼-pitch interval greater than coil pitch interval of said slider coil;
    a current generating circuit for generating sine wave alternating currents of two phases having a phase difference of 90 degrees with respect to each other, said current generating circuit including two sine wave generating circuits for generating said sine wave alternating currents, one of said sine wave generating circuits being driven by a clock signal that is produced from a base clock signal, the two-phase sine wave alternating currents being supplied to said two scaler coils, respectively;
    a displacement signal output circuit for amplifying a current signal from said slider coil that is electromagnetically induced and detected, and also is for converting said amplified current signal into a corresponding rectangular wave signal based on zero-cross attributes of said amplified current signals;
    a phase difference detection circuit for directly comparing a phase difference between said rectangular wave signal and a clock signal obtained from said current generating circuit;
    an interpolation pulse counter for determining digital displacement data from the phase difference detected by said phase difference detection circuit and by counting a time interval corresponding to said phase difference using relatively high-speed interpolation pulses; and an averaging circuit at an output stage of said interpolation pulse counter for calculating and outputting respective average values of respective predetermined pluralities of instances of digital displacement data successively calculated by said interpolation pulse counter, said averaging circuit including a plurality of discrete digital logic components for generating said average values in digital operations, and wherein said averaging circuit includes a full adder circuit for inputting and adding said digital displacement data for every instance of measurement, and a divider circuit for averaging each of said respective pluralities of said instances of digital displacement data added by said full adder by respective numbers of said respective pluralities of said instances of said digital displacement data;

said averaging circuit at said output stage of said interpolation pulse counter thereby permitting accurate position measurements irrespective of any processing imperfections of said slider and/or said scaler and permitting said base clock signal to remain constant irrespective of any frequency changes of said rectangular wave signal.

2. A position sensor according to claim 1, wherein said averaging circuit includes a buffer for temporarily storing input data.

3. A position sensor according to claim 1, wherein said averaging circuit also includes an input buffer and a latch circuit, said input buffer being connected to said output stage of said interpolation pulse counter and to said full adder circuit, said latch circuit also being connected to said full adder circuit and being for storing successive displacement data sums generated by said full adder and for supplying said successive sums to said full adder.

4. A position sensor according to claim 3, wherein said latch circuit is also for being cleared after each respective plurality of said instances of said digital displacement data has been added by said full adder.

5. A position sensor according to claim 3, wherein said averaging circuit further includes another latch circuit for storing respective sums of said respective pluralities of said instances of said digital data, and said latch circuit connected to said full adder is for providing said respective sums to another latch circuit.

6. A position sensor according to claim 5, wherein said averaging circuit also includes another buffer connected to another latch circuit and the divider circuit, said another buffer being for temporarily storing said sums stored in said another latch circuit and for supplying said sums to said divider circuit.

7. A position circuit according to claim 1, wherein said full adder and divider circuits are discrete circuits.

* * * * *

UNITED STATES PATENT AND TRADEMARK OFFICE
CERTIFICATE OF CORRECTION

PATENT NO. : 5,793,202
DATED : August 11, 1998
INVENTOR(S) : Takeshi Ikemoto

It is certified that error appears in the above-identified patent and that said Letters Patent is hereby corrected as shown below:

Claim 1, Col. 6, line 35, "itervals" should be --intervals--.

Signed and Sealed this

Twentieth Day of October, 1998

Attest:

BRUCE LEHMAN

*Attesting Officer*     *Commissioner of Patents and Trademarks*